United States Patent
Wang et al.

(10) Patent No.: US 10,134,446 B1
(45) Date of Patent: Nov. 20, 2018

(54) HEAT-ASSISTED ROTATING DISK MAGNETOMETER FOR ULTRA-HIGH ANISOTROPY MAGNETIC MEASUREMENTS

(71) Applicant: Seagate Technology LLC, Cupertino, CA (US)

(72) Inventors: Kangkang Wang, Fremont, CA (US); Xiaobin Zhu, San Ramon, CA (US); Ganping Ju, Pleasanton, CA (US); Kai Chieh Chang, Pleasanton, CA (US); Yingguo Peng, San Ramon, CA (US); Timothy J. Klemmer, Union City, CA (US); Jan-Ulrich Thiele, Sunnyvale, CA (US); Pin-Wei Huang, Fremont, CA (US)

(73) Assignee: Seagate Technology LLC, Cupertino, CA (US)

( * ) Notice: Subject to any disclaimer, the term of this patent is extended or adjusted under 35 U.S.C. 154(b) by 0 days.

(21) Appl. No.: 15/918,269

(22) Filed: Mar. 12, 2018

Related U.S. Application Data

(60) Division of application No. 15/229,967, filed on Aug. 5, 2016, now Pat. No. 9,916,868, which is a
(Continued)

(51) Int. Cl.
  *G11B 27/36* (2006.01)
  *G11B 7/1267* (2012.01)
  (Continued)

(52) U.S. Cl.
  CPC .......... *G11B 27/36* (2013.01); *G01R 33/0325* (2013.01); *G11B 5/024* (2013.01);
  (Continued)

(58) Field of Classification Search
  CPC .................. G11B 27/36; G11B 7/1267; G11B 2005/0021; G11B 5/024; G11B 5/09;
  (Continued)

(56) References Cited

U.S. PATENT DOCUMENTS

| | | |
|---|---|---|
| 6,477,118 B1 | 11/2002 | Awano |
| 6,483,299 B1 | 11/2002 | Pressesky et al. |

(Continued)

*Primary Examiner* — Ali Neyzari
(74) *Attorney, Agent, or Firm* — Hollingsworth Davis, LLC

(57) ABSTRACT

An apparatus comprises a spindle to rotate a magnetic recording medium and a magnetic field generator to expose a track of the medium to a DC magnetic field. The magnetic field generator is configured to saturate the track during an erase mode and reverse the DC magnetic field impinging the track during a writing mode. A laser arrangement heats the track during the erase mode and, during the writing mode, heats the track while the track is exposed to the reversed DC magnetic field so as to write a magnetic pattern thereon. A reader reads the magnetic pattern and generates a read signal. A processor is coupled to the reader and configured to determine an anisotropy parameter using the read signal. The apparatus can further comprise a Kerr sensor that generates a Kerr signal using the magnetic pattern.

10 Claims, 12 Drawing Sheets

Related U.S. Application Data continuation-in-part of application No. 15/149,361, filed on May 9, 2016, now Pat. No. 9,589,588, which is a continuation of application No. 14/720,250, filed on May 22, 2015, now Pat. No. 9,336,832.

(60) Provisional application No. 62/201,962, filed on Aug. 6, 2015.

(51) Int. Cl.
| | |
|---|---|
| *G11B 5/024* | (2006.01) |
| *G11B 5/09* | (2006.01) |
| *G11B 7/1263* | (2012.01) |
| *G11B 5/455* | (2006.01) |
| *G01R 33/032* | (2006.01) |
| *G11B 5/00* | (2006.01) |

(52) U.S. Cl.
CPC .............. *G11B 5/09* (2013.01); *G11B 5/4555* (2013.01); *G11B 7/1263* (2013.01); *G11B 7/1267* (2013.01); *G11B 2005/0021* (2013.01)

(58) Field of Classification Search
CPC ... G11B 7/1263; G11B 5/4555; G11B 27/136; G01R 33/0325
USPC .................. 369/13.14, 13.13, 13.15, 13.24
See application file for complete search history.

(56) References Cited

U.S. PATENT DOCUMENTS

| | | |
|---|---|---|
| 8,666,692 B2 | 3/2014 | Mizuno |
| 8,787,124 B1 | 7/2014 | Chernyshov et al. |
| 9,336,832 B1 | 5/2016 | Wang et al. |
| 9,589,588 B2 | 3/2017 | Wang et al. |
| 9,916,868 B1 * | 3/2018 | Wang .................. G11B 7/1263 |
| 2011/0058458 A1 | 3/2011 | Rasing et al. |
| 2012/0232831 A1 | 9/2012 | Mizuno et al. |
| 2013/0093419 A1 | 4/2013 | An et al. |

\* cited by examiner

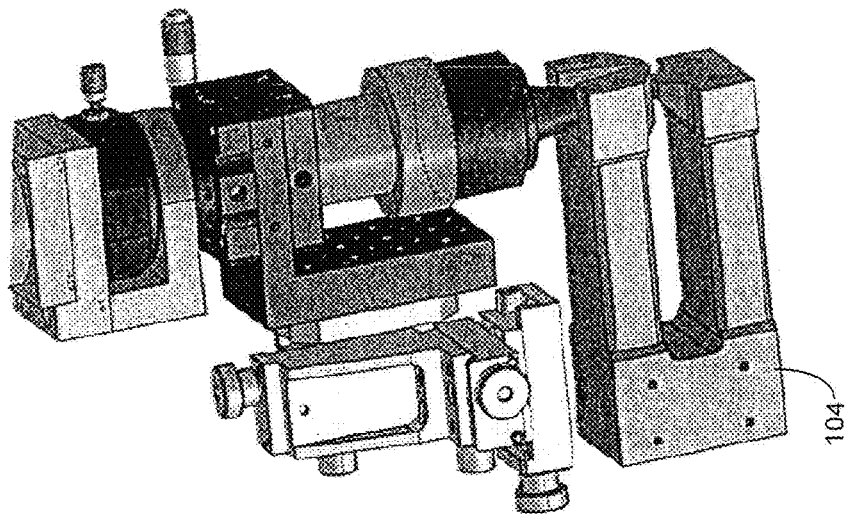
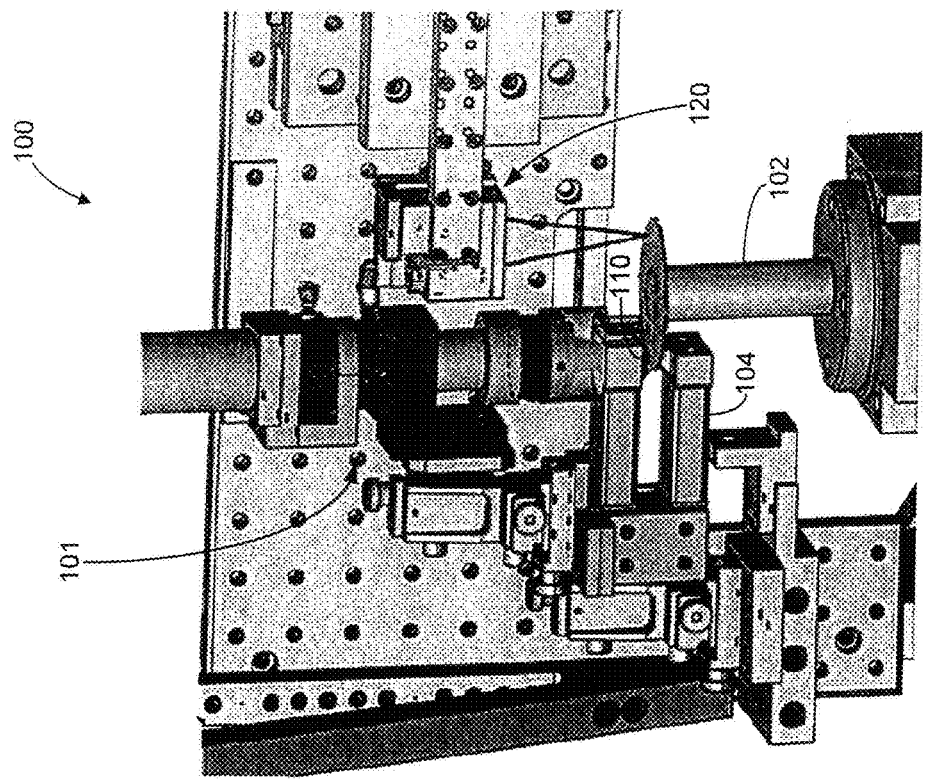

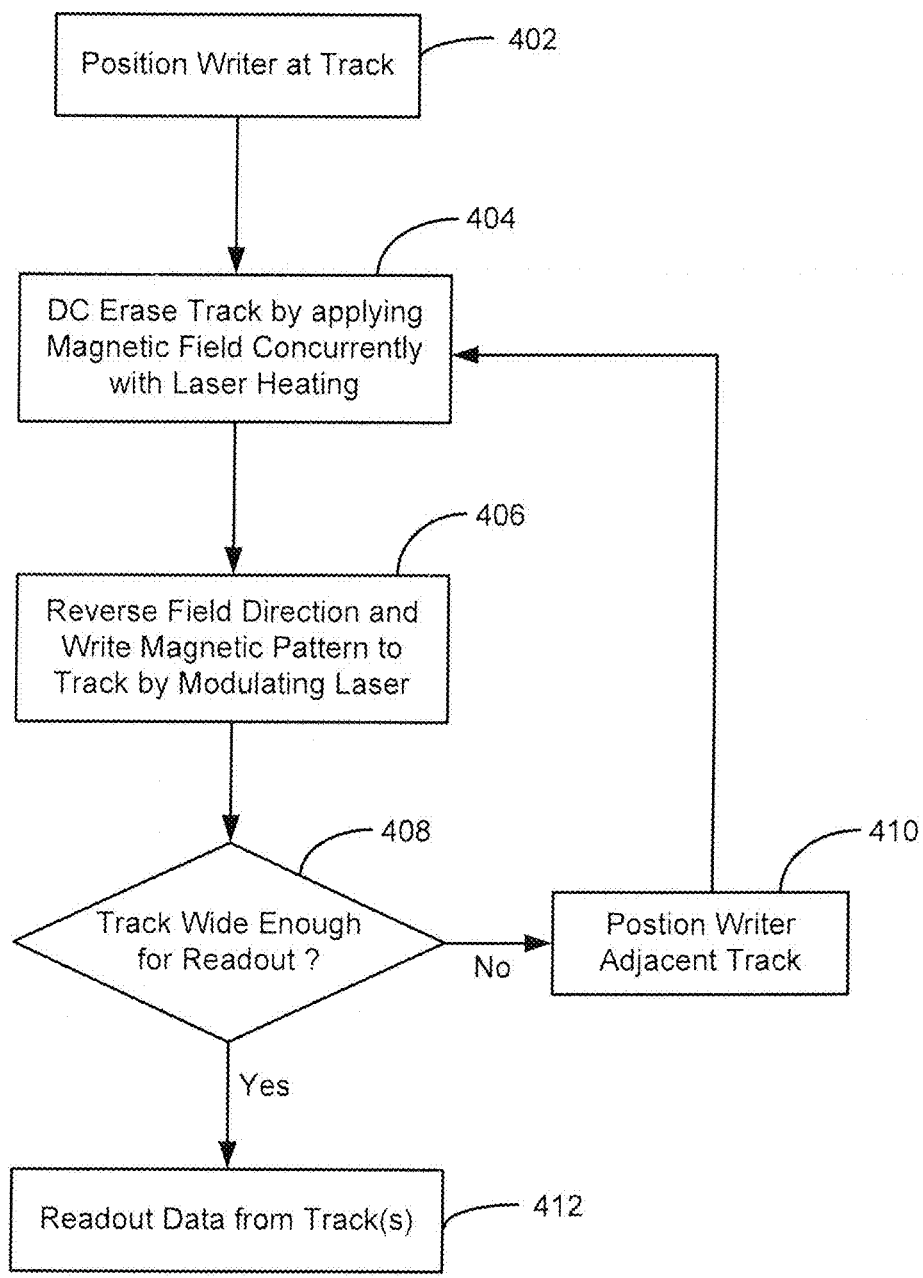

HEAT-ASSISTED ROTATING DISK MAGNETOMETER FOR ULTRA-HIGH ANISOTROPY MAGNETIC MEASUREMENTS

RELATED APPLICATIONS

This application is a divisional of U.S. Ser. No. 15/229,967 filed Aug. 5, 2016, now U.S. Pat. No. 9,916,868, which is a continuation-in-part of U.S. Ser. No. 15/149,361 filed May 9, 2016, now U.S. Pat. No. 9,589,588, which is a continuation of U.S. Ser. No. 14/720,250 filed May 22, 2015, now U.S. Pat. No. 9,336,832, which are incorporated herein by reference in their entireties. This application also claims the benefit of provisional patent application Ser. No. 62/201,962 filed on Aug. 6, 2015, to which priority is claimed pursuant to 35 U.S.C. § 119(e) and which is incorporated herein by reference in its entirety.

SUMMARY

Embodiments are directed to an apparatus comprising a spindle configured to rotate a magnetic recording medium and a magnetic field generator configured to expose a track of the medium to a DC magnetic field. The magnetic field generator is configured to saturate the track during an erase mode and reverse the DC magnetic field impinging the track during a writing mode. A laser arrangement is configured to heat the track during the erase mode and, during the writing mode, heat the track while the track is exposed to the reversed DC magnetic field so as to write a magnetic pattern thereon. A reader is configured to read the magnetic pattern and generate a read signal. A processor is coupled to the reader and configured to determine an anisotropy parameter using the read signal. The apparatus can further comprise a Kerr sensor configured to generate a Kerr signal using the magnetic pattern. The anisotropy parameter can comprise anisotropy field temperature slope data derived from magnetic remanence-thickness product ($M_r t$) and Curie Temperature ($T_c$) distribution data.

Various embodiments are directed to a method comprising rotating a magnetic recording medium proximate a magnetic field generator, a laser arrangement, and an inductive reader. The method also comprises DC erasing a track of the medium by concurrently exposing the track to a first DC magnetic field and heating the track with the laser arrangement. The method further comprises writing a magnetic pattern on the track by concurrently heating the track using the laser arrangement and exposing the track to a second DC magnetic field opposite the first DC magnetic field. The method also comprises reading the magnetic pattern, generating a read signal, measuring reversal probability as a function of power applied to the laser arrangement using the read signal, and determining an anisotropy parameter from the reversal probability. The method can further comprise rotating the magnetic recording medium proximate a Kerr sensor, generating a Kerr signal using the magnetic pattern, and determining an anisotropy parameter of the track using the Kerr signal. The anisotropy parameter can comprise anisotropy field temperature slope data.

Other embodiments are directed to a stack. The stack comprises a substrate and a magnetic recording layer comprising $FePtM_xY$ disposed on the substrate, wherein M comprises doping materials for controlling Curie temperature, and Y comprises a segregant. The magnetic recording layer has an anisotropy field temperature slope ($dHk/dT$) greater than about 200 Oe/K.

Further embodiments are directed to a method for forming a magnetic recording stack. The method includes providing a substrate and epitaxially growing an FePtM alloy magnetic layer on the substrate at a process temperature greater than 450° C., where M comprises doping materials for controlling Curie temperature of the magnetic layer.

The above summary is not intended to describe each disclosed embodiment or every implementation of the present disclosure. The figures and the detailed description below more particularly exemplify illustrative embodiments.

BRIEF DESCRIPTION OF THE DRAWINGS

Throughout the specification reference is made to the appended drawings, where like reference numerals designate like elements, and wherein:

FIG. 2 is a perspective view of a HARDM apparatus in accordance with embodiments of the disclosure;

FIG. 3 is a perspective view of a heat-assisted writer of a HARDM apparatus in accordance with embodiments of the disclosure;

FIG. 4 illustrates various processes of a method for determining one or more magnetic properties of a magnetic recording disk subject to testing by a HARDM apparatus according to the embodiments shown in FIGS. 1-3;

The figures are not necessarily to scale. Like numbers used in the figures refer to like components. However, it will be understood that the use of a number to refer to a component in a given figure is not intended to limit the component in another figure labeled with the same number.

DETAILED DESCRIPTION

Figure 1:
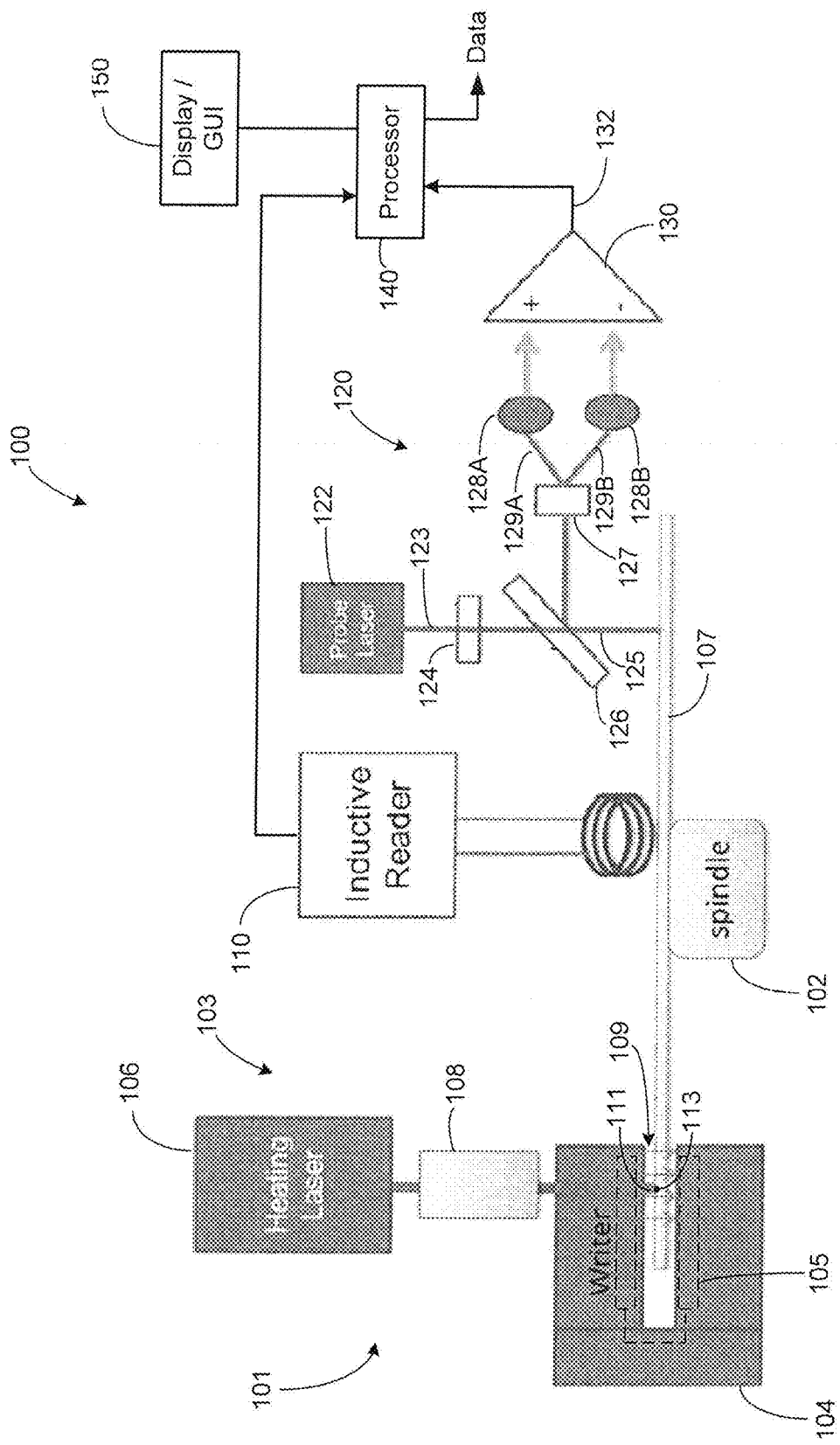
FIG. 1 is a block diagram of a heat-assisted rotating disk magnetometer (HARDM) apparatus in accordance with embodiments of the disclosure.

In the following description, reference is made to the accompanying set of drawings that form a part of the description hereof and in which are shown by way of illustration several specific embodiments. It is to be understood that other embodiments are contemplated and may be made without departing from the scope of the present disclosure. The following detailed description, therefore, is not to be taken in a limiting sense.

Unless otherwise indicated, all numbers expressing feature sizes, amounts, and physical properties used in the specification and claims are to be understood as being modified in all instances by the term "about." Accordingly, unless indicated to the contrary, the numerical parameters set forth in the foregoing specification and attached claims are approximations that can vary depending upon the desired properties sought to be obtained by those skilled in the art utilizing the teachings disclosed herein. The use of numerical ranges by endpoints includes all numbers within that range (e.g., 1 to 5 includes 1, 1.5, 2, 2.75, 3, 3.80, 4, and 5) and any range within that range.

Magnetic recording media with extremely high (e.g., ultra-high) anisotropy requires magnetic fields with very high magnetic flux density to characterize various magnetic properties of the media material. To ensure that magnetic recording disks meet certain standards of quality, these magnetic properties need to be tested from time to time, particularly during the manufacturing process. Heat-Assisted Magnetic Recording (HAMR), for example, is a potential recording technology to extend areal density by recording high anisotropy media at elevated temperature. Hence, the Curie temperature (TO distribution is very important for media recording performance. At the same time, the magnetic remanence-thickness product ($M_r t$) is very important for readout amplitudes and DC noise. An advantage of HAMR media in enabling a high recording density is its high anisotropy field gradient over temperature, i.e. $dH_k/dT$. Thus, distributions in switching field and switching temperature also play important roles in determining recording performance of HAMR media. However, it remains a challenge to characterize these important media magnetic properties with good reliability and high throughput. A conventional rotating disc magnetometer, for example, cannot write HAMR media which has very high coercivity, while a high-field VSM (Vibrating Sample Magnetometer) has very low throughput and also causes destructive damage to the disk (i.e., cutting).

Embodiments are directed to a laser-heating assisted electromagnetic writer and reader apparatus and method, with which magnetic patterns (e.g., low frequency patterns) are written on, and read from, high coercivity media such as those used in HAMR. Embodiments of the disclosure provide for measuring $M_r t$, the Curie temperature distribution ($\sigma T_C$), the field temperature slope ($dH_k/dT$) of granular FePtX media, and other magnetic properties of sample disks having a wide range of coercivity (e.g., ~5-100 kOe, such as between ~15 kOe and 50 kOe) with very high throughput, high reliability, and in a manner that is nondestructive to the sample disks. Some embodiments are directed to evaluating reversal (switching) probability as a function of laser power in the presence of a uniform external field. This measurement can be used to extract important magnetic properties of the subject disk, such as $T_C$ distribution. Other embodiments provide for a quick measure of laser power requirements without having to go through time consuming spin-stand testing and address key factors for producing media with high anisotropy temperature slope.

Figure 13:
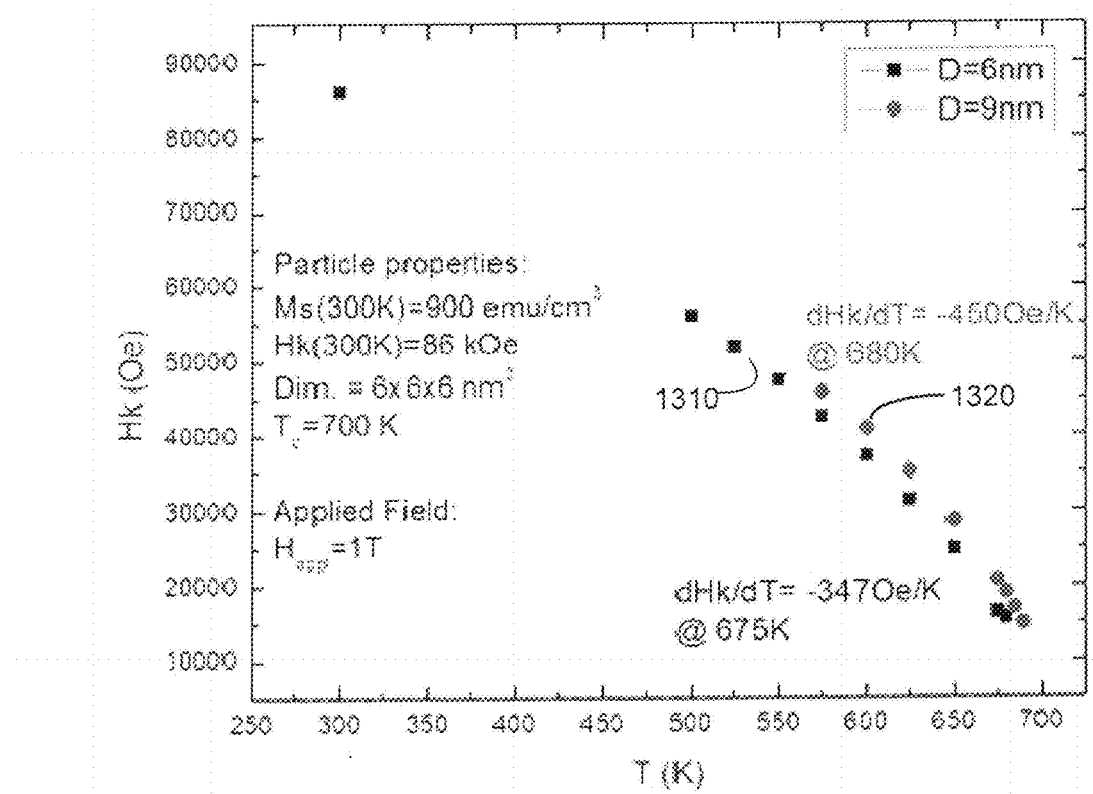
FIG. 13 shows calculated anisotropy field as a function of temperature for two different grain diameters in accordance with various embodiments.

Using an inductive reader or magneto-optic Kerr effect, remanent magnetic moment or switching probability of an ensemble of FePtX grains is measured as a function of both external magnetic field and laser heating power. The switching probability data provides direct insights into various distributions in the media including $T_C$, $H_k$, and volume distributions. Furthermore, the field temperature slope ($dH_k/dT$), at close to recording temperature, can be extracted from the experimental data. This is closely related to the effective field gradient, together with thermal gradient, for HAMR via $dH/dx=dH_k/dT*dT/dx$. Samples with controllably tuned fabrication parameters, including grain size, are studied to reveal their impact on the temperature slope of anisotropy field for HAMR media. Atomistic modeling has been used to help better understand the measurement techniques and is compared to experimental results. One example of the modeled temperature dependence of the anisotropy field is shown in FIG. 13 described herein. Such comparison between the model and experiments allow a better understanding of the technique and implication for factors controlling parameters enabling high density HAMR.

A challenge to measuring these important media magnetic properties with good reliability and high throughput is presented by high field VSM (Vibrating Sample Magnetometer) having very low throughput and also causing destructive damage to the disk, e.g., cutting. However, utilizing a tool such as a HARDM, both media temperature and external field can be controllably varied. Switching probability as a function of both media temperature (laser power) and magnetic field strength can be measured in a quick and non-destructive fashion using Magneto-optic Kerr Effect. This data can be used to extract anisotropy field gradient of HAMR media. Using a HARDM provides improved throughput compared to VSM and, in contrast, is nondestructive. With the HARDM, anisotropy field gradients of samples can be measured spanning a large coercivity range (Hc~5-100 kOe).

Various embodiments are directed to a HARDM that utilizes a specially designed heat-assisted writer to record low density waveforms on high coercivity recording media. This enables, for example, the readout of MA values by sensing the magnetic waveforms written to the media. According to some embodiments, a HARDM apparatus includes a laser heating assisted writer, a rotating disk motion platform, a reader (e.g., an inductive reader), and a Kerr sensor. In some embodiments, the Kerr sensor is excluded from the HARDM apparatus or is an optional component. In other embodiments, the reader is excluded from the HARDM apparatus or is an optional component. The HARDM apparatus can be automated and implemented to include a graphical user interface.

As described herein, a specially designed writer assisted by a far-field laser heating source, including, but not limited to, a HARDM, is used to record low frequency magnetic patterns. Methods for measuring the switching probability of HAMR media as a function of laser power and applied magnetic field strength are described as well as methods for extracting anisotropy field temperature slopes from the acquired switching probability data. Further, methods for producing HAMR media with anisotropy field temperature slopes of greater than 300 Oe/nm (dHk/dT>300 Oe/nm) are provided.

With reference to FIG. 1, an example instrument setup for measuring anisotropy field gradient is illustrated. A specially designed electromagnetic writer is used to apply a uniform magnetic field perpendicular to a sample surface (0 to 2 Tesla), while a high power laser source (several watts) is used to heat up a media sample to, and above, the sample's Curie temperature. By adjusting the current applied to the writer, magnetic field strength can be controlled. By adjusting laser power and/or laser pulse width, temperature of the media can also be controlled. An inductive reader or a Kerr sensor is used to read out the remanent magnetic signal. As illustrated in FIG. 1, the Kerr sensor consists of a low power probing laser (e.g., a few milliwatts), a linear polarizer, a beam splitter, a polarizing prism, photodiodes, and instrumentation amplifiers. The instrument setup shown in FIG. 1 is one example. Other setups can also be utilized as long as external field and temperature can be independently controlled, and magnetic moments can be sensed. Other examples can include using a pump-probe setup coupled with an electromagnet.

In FIG. 1, a HARDM apparatus 100 is illustrated in accordance with an embodiment of the disclosure. FIG. 2 is a perspective view of an experimental setup of a HARDM apparatus 100 according to various embodiments. FIG. 3 is a perspective close-up view of heat-assisted writing components of the HARDM apparatus 100. The HARDM apparatus 100 includes a spindle 102 configured to rotate a magnetic recording medium 107 relative to a heat-assisted writer 101, an inductive reader 110, and a Kerr sensor 120 (which may be an optional component according to some embodiments). The heat-assisted writer 101 includes a writer 104 and a magnetic field generator 105, such as an electromagnet. The magnetic field generator 105 can be implemented to generate a magnetic field of up to about 2 Tesla perpendicular to the surface of the medium 107. The magnetic field generator 105 may be built into the writer 104 or be attached or placed in proximity to the writer 104. The magnetic field generator 105 is configured to expose a portion 109 (e.g., a track) of the medium 107 to a DC magnetic field, such as during an erase mode and a writing mode.

The heat-assisted writer 101 includes a laser arrangement 103 configured to heat the medium portion 109 (e.g., track) rotating through the writer 104. The laser arrangement 103 includes a heating laser 106 optically coupled to beam shaping optics 108, which serve to focus a light beam exiting an output 111 of the laser arrangement 103 onto the medium portion 109. Adjustable laser beam shaping optics 108 are incorporated into the laser arrangement 103 for achieving a tight focus on the media surface. With a high power laser source (e.g., several Watts), media can be heated to and above its Curie temperature. High coercivity media, such as those used in HAMR, have a much lower coercivity at elevated temperature, allowing easy switching under a moderate external magnetic field (e.g., <2 Tesla). By adjusting laser power and/or laser pulse width and/or duty cycle, temperature of the media can be controlled.

During an erase mode, the magnetic field generator 105 is configured to generate a DC magnetic field that saturates the medium portion 109 while the laser arrangement 103 heats the medium portion 109. This serves to orient the magnetic grains of the medium portion 109 in a specified direction (e.g., down). During a writing mode, the magnetic field generator 105 is configured to reverse the DC magnetic field impinging the medium portion 109 while the laser arrangement 103 heats the medium portion 109. This serves to orient the magnetic grains of heated regions of the medium portion 109 in the opposite direction (e.g., up), thereby writing a magnetic pattern to the medium portion 109.

The HARDM apparatus 100 further includes a reader 110 configured to read the magnetic pattern written to the medium portion 109. The reader 110 is shown positioned proximate the spindle 102, but can be located elsewhere. The reader 110 generates a read signal in response to reading the magnetic pattern written to the medium portion 109. In some embodiments, the reader 110 is implemented as an inductive reader. In other embodiments, the reader 110 can be implemented using other read transducer technologies (e.g., a magnetoresistive reader). An inductive reader 110 can be employed in the HARDM apparatus 100 to provide a more accurate readout of the total magnetic moment of the medium portion 109 as compared to that provided by the Kerr sensor 120, as is further discussed hereinbelow. A processor 140 is coupled to the reader 110 and configured to measure one or more magnetic properties of the medium portion using the read signal. The processor 140 can be coupled to a display 150 (or graphical user interface) with which various measurements and data can be presented and generated. The read signal and/or data developed from the read signal can be output to another device or system.

In some embodiments, the HARDM apparatus 100 includes a Kerr sensor 120, in addition to or exclusive of the inductive reader 110. The Kerr sensor 120 includes a probe laser 122 (which produces incident beam 123 at a power of a few milliwatts), linear polarizer 124, beam splitter 126, polarizing prism (e.g., Wollaston prism) 127, photodiodes 128A and 128B, and differential amplifier 130. In some implementations, the differential amplifier 130 can be coupled to a lock-in amplifier (not shown). The lock-in amplifier, using the output signal 132 from the differential amplifier 130, can be configured to determine the real and imaginary components of the signal 132 and generate an output signal representative of same. During testing, incident beam 123 produced by the laser 122 passes through the polarizer 124 and beam splitter 126. Incident beam 123 is reflected at the surface of the disk 107 and undergoes a polarization alteration due to the magnetization of the disk 107. A reflected beam 125 is reflected by the beam splitter 126 to a detection arm which includes the Wollaston prism 127 and photodiodes 128A and 128B.

The Wollaston prism 127, or other analyzer, is used to separate polarized beam components 129A and 129B of the reflected beam 125. Photodiodes 128A and 128B provide positive and negative input signals to differential amplifier 130. The output of differential amplifier 130 is a signal 132 representing a difference in intensity of components 129A and 129B of the reflected beam 125, which is proportional to the change of magnetization at the magnetic pattern region of the disk 107. If included, the lock-in amplifier, using the output signal 132 from differential amplifier 130, is configured to determine the real and imaginary components of the signal 132 and generate an output signal representing same.

After writing a magnetic pattern (e.g., a low frequency square wave pattern) using the laser-heating assisted writer, a Kerr sensor can be used to read out the magnetic signal. Using the Kerr signal 132, the processor 140 can produce various data about the magnetic properties of the portion of the medium 109 written with the magnetic pattern. Such magnetic properties include once-around variation and remanent magnetization, for example.

FIG. 4 illustrates various processes of a method for determining one or more magnetic properties of a magnetic recording disk subject to testing by a HARDM apparatus 100 according to the embodiments shown in FIGS. 1-3. Initially, a disk 107 is placed on the spindle 102 such that the disk 107 passes under the output 111 of the laser arrangement 103. As the disk 107 passes within the writer 104, the portion 109 passing under the output 111 of the laser arrangement 103 can concurrently be subject to a DC magnetic field produced by the magnetic field generator 105. A circumferential region of the disk 107 passing under the output 111 of the laser arrangement 103 defines a track 113 to be written by the heat-assisted writer 101 and read by one or both of the reader 110 and the Kerr sensor 120.

According to the method illustrated in FIG. 4, the output 111 of the heat-assisted writer 101 is positioned 402 relative to the track 113, such as the center of the track 113. In some embodiments, the heat-assisted writer 101 can be configured for movement relative to a stationary spindle 102. In other embodiments, the heat-assisted writer 101 can be stationary, and the spindle 102 can be configured for movement relative to the stationary writer 101. In further embodiments, both the writer 101 and the spindle 102 can be configured for movement. It is noted that movement of one or both of the writer 101 and the spindle 102 can be implemented to be fully automatic (e.g., computer and motor control), fully manual (e.g., operator control), or partially automatic/partially manual. It is also noted that disk 107 is typically a blank disk devoid of pre-written servo tracks, and that encoders on the motion stages of the apparatus 100 can be used to locate tracks on the disk 107 as they are written.

With the writer output 111 properly positioned relative to the disk 107, the track 113 is subject to DC erasure 404. DC erasure 404 of the track 113 involves concurrently subjecting the track 113 to heat (e.g., between about room temperature and about 1000° C.) and a DC magnetic field (e.g., <1.5T) sufficient to saturate the track 113, such that the magnetic grains of the track 113 are oriented in a down direction. DC erasure 404 can be performed in other ways, such as by the application of a high magnetic field (e.g., >6T) without the need to heat the disk 107. The erasure process requires a full disk revolution to complete, which can take about 0.25 seconds, for example. After completing the erasure process, the HARDM apparatus 100 can be transitioned from the erasure mode of operation to a write mode.

Writing to the track 113 using the HARDM apparatus 100 involves reversing 406 the DC magnetic field to the direction (e.g., up) opposite that used during the DC erasure process. While subjecting track 113 to the opposite DC magnetic field, the laser arrangement 103 is modulated on and off at a desired frequency to write a magnetic pattern to the track 113. The magnetic pattern written to the track 113 can be a low frequency square wave, such as one between about 1 and 100 flux changes per inch (fci), for example. The region of the track 113 passing through the writer 104 during laser-on periods will be magnetized up, while the region of the track 113 passing through the writer 104 during laser-off periods will remain magnetized down. This results in the successful writing of a single track 113. The track width can be adjusted by adjusting the optical focus, and the pattern frequency can be adjusted by adjusting the laser modulation frequency. The writing process requires a full disk revolution to complete, which can take about 0.25 seconds, for example. As such, the erasing and writing processes for a single track 113 can take about 0.5 seconds.

Depending on the magnetic properties being evaluated and the type of sensing used to read the magnetic pattern written to the track 113, a single track 113 may be sufficient or multiple tracks 113 may be needed for the particular evaluation. A check 408 is made to determine if the track 113 written to the disk 107 is wide enough for readout by the particular sensor being used for a particular evaluation. For example, if the Kerr sensor 120 is to be used for a specified magnetic property evaluation, a single track 113 (i.e., the width of a single track) containing the magnetic pattern may be sufficient. If an inductive reader 110 is to be used, several tracks may be needed to provide sufficient readout for the reader 110. If the existing track or tracks 113 are not sufficiently wide, the writer output 111 can be positioned 410 to a track adjacent the one or ones that have been previously written The erasing and writing processes 404 and 406 can be repeated for the adjacent track or tracks. After completion of the writing process, and after a track(s) of sufficient width has been written to the disk 107, one or both of the reader 110 and Kerr sensor 120 can read 412 the magnetic pattern written to the track(s). A processor 140 may then operate on the signal produced by one or both of the reader 110 and Kerr sensor 120 to determine one or more magnetic properties of the disk 107.

According to some embodiments, the processes illustrated in FIG. 4 can be implemented in a method for determining the value of $M_r t$ for a magnetic recording disk subject to testing by a HARDM apparatus 100. For $M_r t$ reading using an inductive reader 110, for example, usually multiple neighboring tracks 113 need to be written to form a track wide enough to provide a signal useful for the reader 110 (e.g., a signal wide enough to provide a good signal-to-noise ratio). According to some embodiments, a number of tracks 113 can be "stitched" together to form a single or composite track having a width that can be readily detected by the reader 110.

Figure 6:
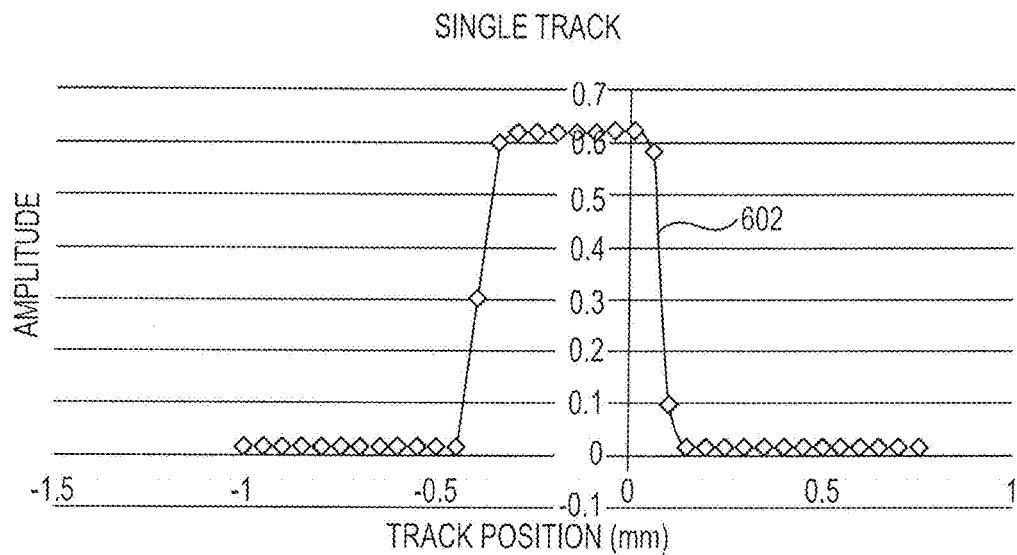
FIG. 6 shows a magnetic pattern written to a single track of a magnetic recording disk subject to testing by a HARDM apparatus in accordance with various embodiments.
Figure 7:
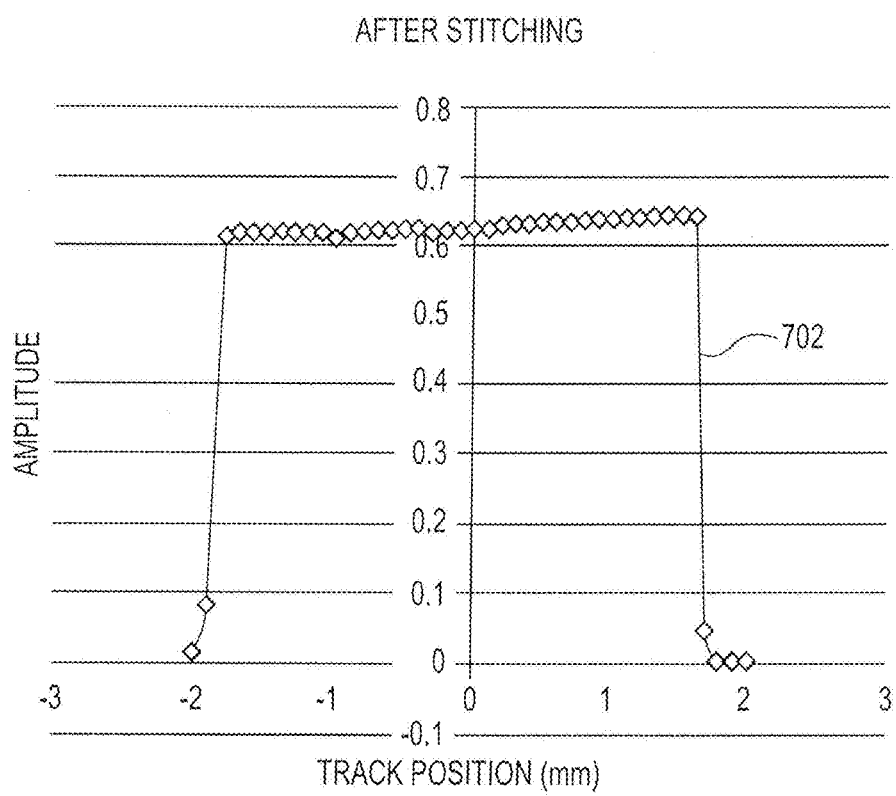
FIG. 7 shows a magnetic pattern that spans several tracks, and is formed by stitching together several neighboring tracks in accordance with various embodiments.

FIG. 6 shows a magnetic pattern 602 written to a single track which, in this illustrative example, has a track width of about 0.4 mm. FIG. 7 shows a magnetic pattern 702 that spans several tracks, and is formed by stitching together several neighboring tracks. In the illustrative example shown in FIG. 7, several tracks are stitched together for forming a wide track having a width of about 3.5 mm. By way of example, 10 narrow tracks can be stitched together to form a relatively wide >3 mm track, taking about 5 seconds to create (2.5 seconds of erasure time and 2.5 seconds of writing time). After stitching tracks, the disk 107 can be spun to a speed for inductive readback. For example, the disk 107 can be rotated at a speed of between about 5 and 500 RPM during the erasure/writing phases, and then increased to between about 1,000 and 10,000 RPM during the readback phase.

Figure 8:
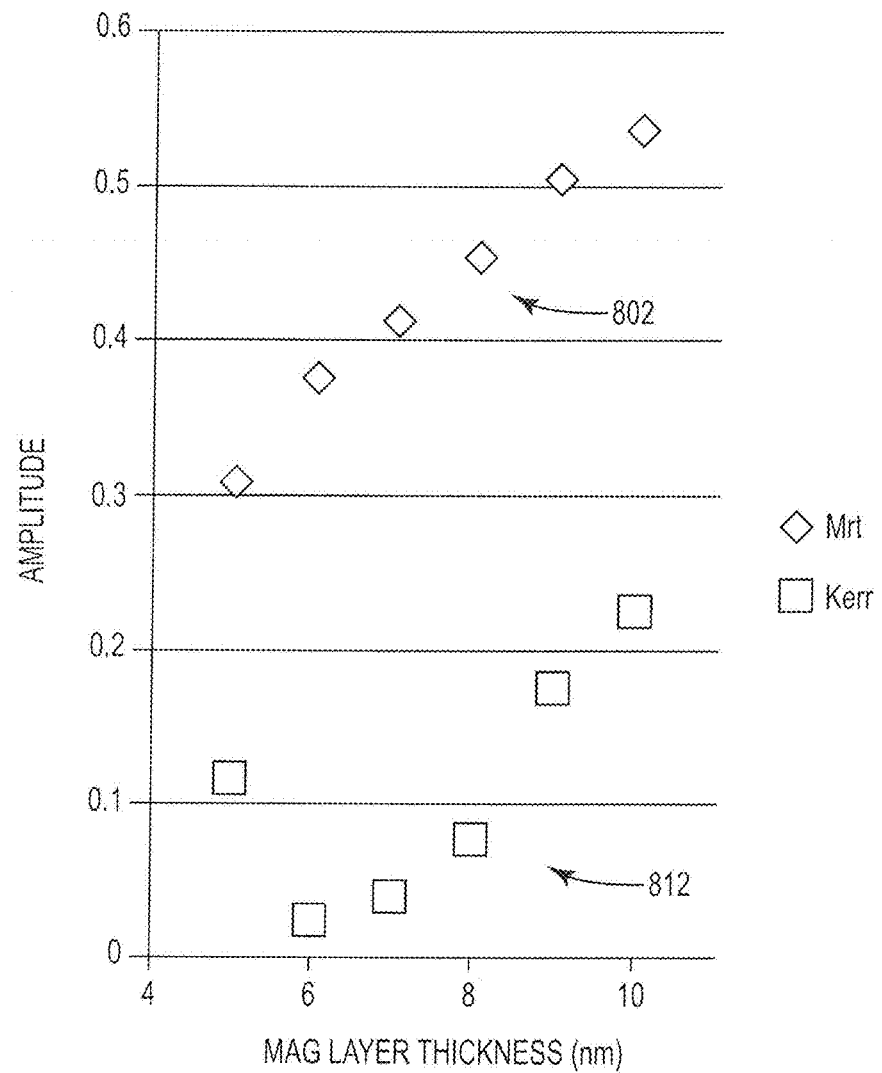
FIG. 8 shows data plots representing values of Mrt obtained from reading a stitched track containing a magnetic pattern respectively using an inductive reader and a Kerr sensor according to various embodiments.

Example $M_r t$ data is shown in FIG. 8. FIG. 8 shows $M_r t$ evaluation results on a group of samples with increasing magnetic layer thickness. The data plot 802 represents values of $M_r t$ obtained from reading a stitched track containing a magnetic pattern using an inductive reader 110. The data plot 812 represents values of $M_r t$ obtained from reading a stitched track containing a magnetic pattern using a Kerr sensor 120. It can be readily seen that $M_r t$ readback using an inductive reader 110 is much more reliable in determining the total magnetic moment than when using a Kerr sensor 120. For example, it can be seen that the $M_rt$ values for the data plot 802 are linearly proportional to magnetic layer thickness, unlike the Kerr signal data plot 812. This is because the Kerr sensor 120 relies on optical properties of the media, which can be changed by layer structure, material used, wavelength dependence, and many other factors.

Figure 5:
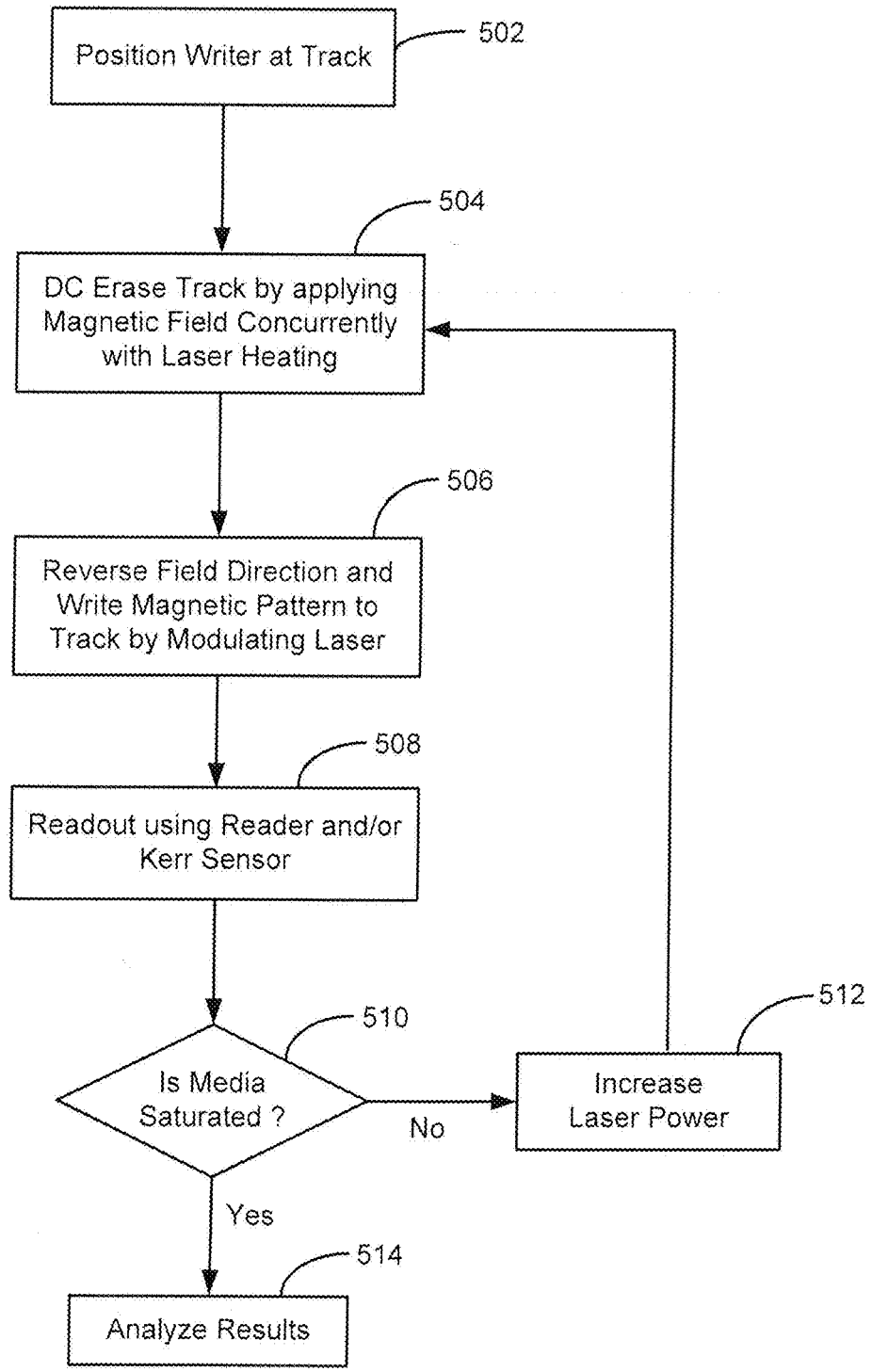
FIG. 5 illustrates various processes for measuring reversal (switching) probability as a function of laser power using a HARDM apparatus in accordance with embodiments of the disclosure.

FIG. 5 illustrates various processes for measuring reversal (switching) probability as a function of laser power using a HARDM apparatus 100 in accordance with embodiments of the disclosure. According to various embodiments, with a constant magnetic field applied, laser power is incremented to achieve higher and higher temperature at the media. Remanent magnetization is recorded after each increment in laser power. The recorded remanent magnetization as a function of laser power can be used to extract and analyze Curie temperature distribution of the media.

According to the method illustrated in FIG. 5, the output 111 of the heat-assisted writer 101 is positioned 502 relative to the track 113, such as the center of the track 113. Initially, the power of the laser arrangement 103 is set to a low level, such as a level below that required to change the orientation of the magnetic grains of the track 113. With the writer output 111 properly positioned relative to the disk 107, the track 113 is subject to saturation or DC erasure 504, in which both heat (e.g., laser heating) and a uniform DC magnetic field (typically with an amplitude of 1 Tesla and a field direction facing down toward the media top surface) are applied to the track 113. While subjecting track 113 to a DC magnetic field opposite that used during the erasure process, the laser arrangement 103 is modulated on and off at a desired frequency to write 506 a magnetic pattern (e.g., a low frequency square wave) to the track 113. The magnetic pattern may be a low frequency square wave pattern written by reversing the magnetic field to the opposite direction (up) while modulating the laser heating (i.e., turning the laser on and off with certain frequency). The media disk surface region passing through the writer during the laser-on periods will be magnetized up when the media coercivity is reduced by heating to below the external field applied, while the region passing during the laser-off periods will remain magnetized down because the external magnetic field alone cannot switch the media grains without laser heating. This results in the writing of a single track on the media surface of interest. The pattern frequency can be adjusted by adjusting the laser modulation frequency. Under normal experimental conditions, this procedure takes less than 0.5 seconds to finish writing the pattern needed.

The method of FIG. 5 further involves performing a readout 508 using the inductive reader 110 or the Kerr sensor 120. The readout data can be used to generate data such as that shown in FIGS. 9, 14, and 15 (i.e., reversal probability vs. laser power). A check 510 is made to determine if the track 113 is saturated. If not, the power of the laser arrangement 103 is increased slightly (e.g., by about 1%). The processes of blocks 504, 506, 508, and 510 are repeated until it is determined that the track 113 is saturated. When no further change is observed in the remanent magnetization upon increasing laser power, the track 113 is considered saturated. The readout data is then analyzed 514 and/or a different field value is applied and the process repeated. For example, remanent magnetization is measured and recorded after writing with each increment in laser power, and this data is readout and analyzed. As another example, reversal probability is measured as a function of applied laser power. A single track is written with a low laser power first. The laser power is then gradually increased to eventually achieve full saturation (reversal probability=1). The entire reversal probability curve is measured under the same external field (e.g., 1 Tesla).

Figure 9:
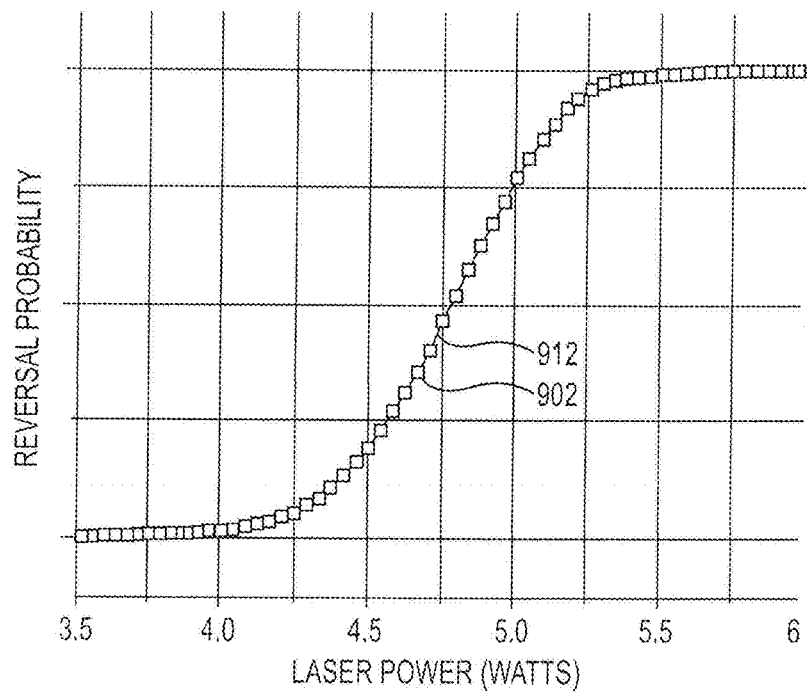
FIG. 9 is a graph showing reversal probability as a function of laser power developed from data acquired by a HARDM apparatus in accordance with various embodiments.

FIG. 9 is a graph showing reversal probability as a function of laser power. The data of FIG. 9 represents analysis results produced at block 514 of FIG. 5. The reversal probability versus laser power curve of FIG. 9 can be fitted with a nonlinear function such as a bi-error function. FIG. 9 shows such a fitting to the experimental result, with excellent accuracy. The black squares 902 are experimental data, and the solid line 912 is a nonlinear fit using bi-error functions. The derived fitting parameters provide important information such as sigma $T_C$ and laser power requirement. For example, to quantify the sharpness of the reversal probability curve such as that shown in FIG. 9, nonlinear fitting based on error functions can be used to fit the experimental curve. From the fitting parameters, one can extract the standard deviation and peak position. These fitted parameters can then be used to derive important metrics such as sigma $T_C$ and laser power requirement.

Figure 10:
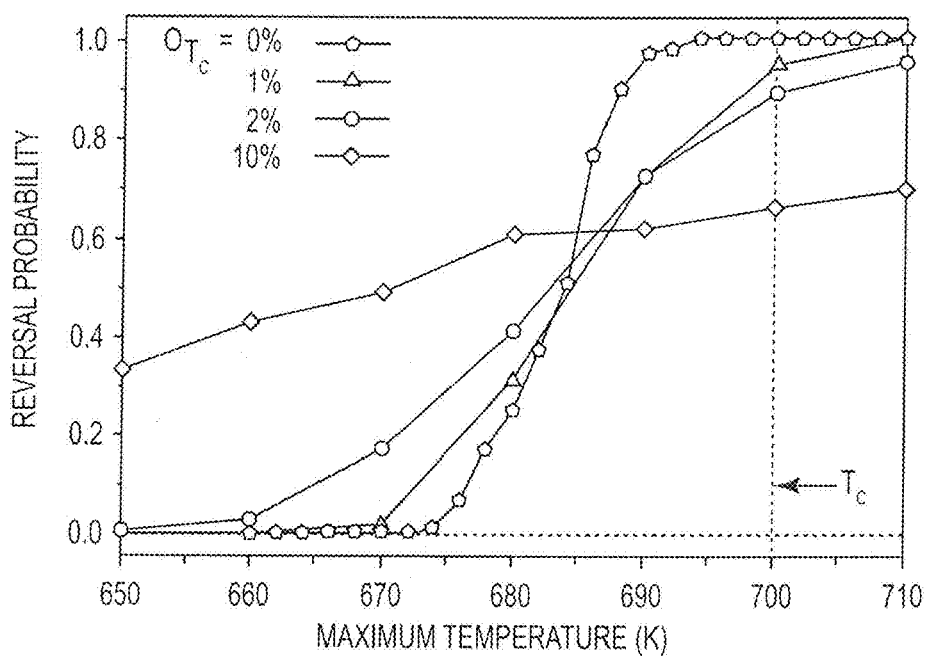
FIG. 10 shows a modeling result on the effect of Curie Temperature distribution developed from data derived from fitting parameters for the curve shown in FIG. 9.

FIG. 10 shows a modeling result on the effect of sigma $T_C$. As is clearly illustrated, a larger sigma $T_C$ results in a much shallower reversal probability slope. Therefore, the steeper the curve is, the narrower the distributions are. For example, assuming the media's temperature rise from ambient, $T_{amb}$, is linearly proportional to the heating laser power P:

$$T - T_{amb} = \alpha P$$

From the above, the following relationship between $$\frac{\sigma T_c}{T_c}$$

and $$\frac{\sigma P}{P_{50}}$$

can be obtained:

$$\frac{\sigma T_c}{T_c} = \frac{\alpha \times \sigma P}{T_{amp} + \alpha \times P_{50}}$$

Where $P_{50}$ is the laser power required to achieve 50% reversal probability. Assuming $P_{50}$ corresponds to Tc, the following can be obtained:

$$T_c - T_{amb} = \alpha P_{50}$$

Combining this equation with the equation above, the following is obtained:

$$\frac{\sigma T_c}{T_c} = \left(1 - \frac{T_{amb}}{T_c}\right) \frac{\sigma P}{P_{50}}$$

Using 300 K for $T_{amb}$ and 700 K for $T_c$, the following is obtained:

$$\frac{\sigma T_c}{T_c} \approx 0.57 \times \frac{\sigma P}{P_{50}}$$

With this last equation, sigma Tc can be easily derived from the measured sigma laser power and P50 laser power, both of which can be obtained by fitting the reversal probability curve of FIG. 9.

Figure 11:
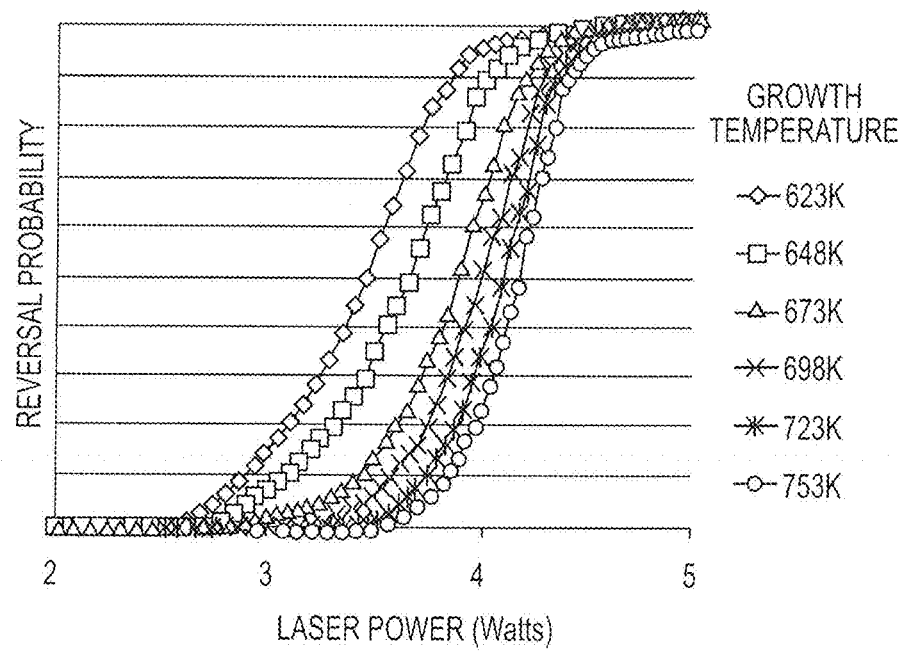
FIG. 11 shows data plots of reversal probability as a function of laser power for a ladder of heat-assisted magnetic recording (HAMR) media deposited at different temperature in accordance with various embodiments.
Figure 12:
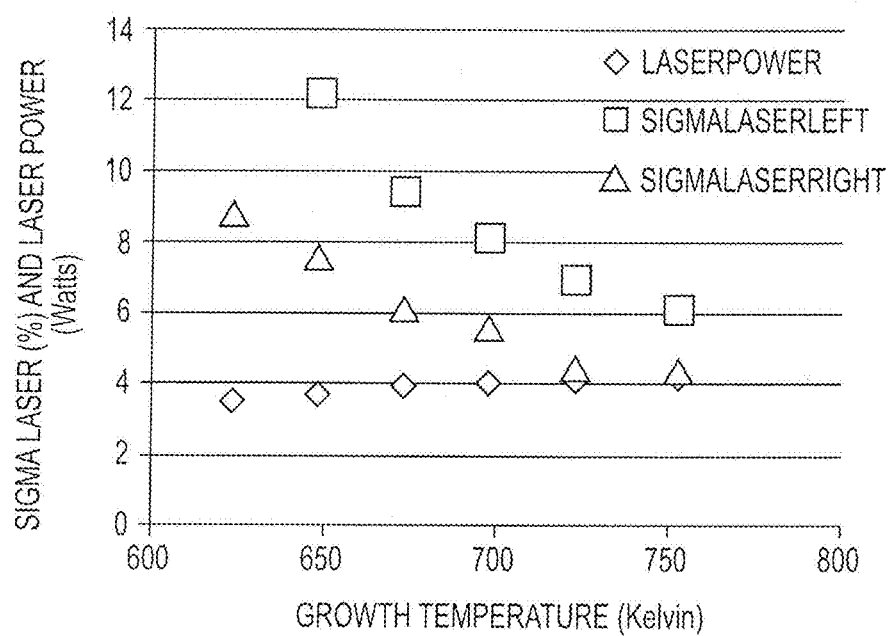
FIG. 12 illustrates extracted laser power requirement data showing higher power needed for HAMR media samples grown at higher temperature, and the extracted distributions for such a ladder of HAMR media in accordance with various embodiments.

FIGS. 11 and 12 show the analysis results on a group of samples with varying deposition temperature. FIG. 11 shows data plots of reversal probability as a function of laser power for a ladder of HAMR media deposited at different temperature. FIG. 12 illustrates extracted laser power requirement data showing higher power needed for HAMR media samples grown at higher temperature, and the extracted distributions for such a ladder of HAMR media. It can be seen in FIG. 12 that distributions narrow down as growth temperature is increased. The data of FIGS. 11 and 12 demonstrates that higher deposition temperature facilitates better growth and film quality, which then results in smaller distributions. The measurement results shown in FIGS. 11 and 12 clearly reflect this trend, demonstrating the accuracy and reliability of both the disclosed measurement method and apparatus. For a more in-depth analysis, as is reflected in FIG. 12, a bi-error function can be used instead of a single error function. The two halves of the reversal probability curve can be fitted differently, deriving two standard deviation values, sigma Laser left, and sigma Laser right. While the left side standard deviation can be affected by distributions in the media's anisotropy and grain size, the right side standard deviation is more closely related to the media's $T_C$ distribution.

As mentioned above, an advantage of HAMR media in enabling a high recording density is its high anisotropy field gradient over temperature, i.e. $dH_k/dT$. Thus, distributions in switching temperature and switching field also play an important role in determining recording performance of HAMR media. With reference to FIG. 13, atomistically calculated anisotropy field values are shown as a function of temperature for two different grain diameter sizes. Results for grain diameters of about six nanometers are shown with data plot 1310, and results for grain diameters of about nine nanometers are shown with data plot 1320. While both the zero-degree anisotropy field (86 kOe) and the Curie temperature (700 K) are fixed to be the same for both diameter sizes of FePt particles (the grains), the anisotropy field gradients differ due to different magnetic volumes. The FePt grains with a nine nanometer diameter had a gradient of −450 Oe/K; whereas, the FePt grains with a six nanometer diameter had a gradient of −347 Oe/K when measured at about the same temperature. Larger sized particles tend to have a higher field gradient than smaller sized particles at close to Curie temperature. Therefore it is important to monitor the field gradient values, especially as areal density is improved by lowering media grain size.

Anisotropy at various sample temperatures can be measured directly by, for example, heating up the sample and measuring torque under applied field. However, such methods usually require bulky experimental setups and cutting of samples to smaller sizes. Also such measurements usually have very low throughputs. Using an instrument setup as described in FIGS. 1-3 provides a fast, non-destructive way to measure anisotropy field gradient by measuring shifts in blocking temperature under changing external reversal magnetic fields. As can be seen from FIG. 13, anisotropy field lowers as temperature increases. Therefore when the external magnetic field strength is increased during switching, switching temperature should correspondingly decrease. By quantitatively measuring the shift in switching temperature as a function of external applied magnetic field, anisotropy field temperature slope (dHk/dT) can be derived at the measured temperature range.

Using a HARDM as described above, reversal probability as a function of laser power for a disk, or a track of a disk, can be plotted. The sharpness of such reversal probability curves contains information about the distribution in anisotropy field and distribution in Curie temperature. The reversal probability curve can be fitted with an error function, as discussed above, to obtain the distribution in Curie temperature (sigma TO of the sample (e.g., disk). To measure the anisotropy field gradient, several reversal probability curves are obtained under different external field values (e.g., 0.6T, 0.8T, 1T, and 1.2T or from 6-12 kOe). Examples of experimental data, and parameters derived therefrom, for anisotropy field temperature slope (dHk/dT) are shown in FIGS. 14-17.

Figure 14:
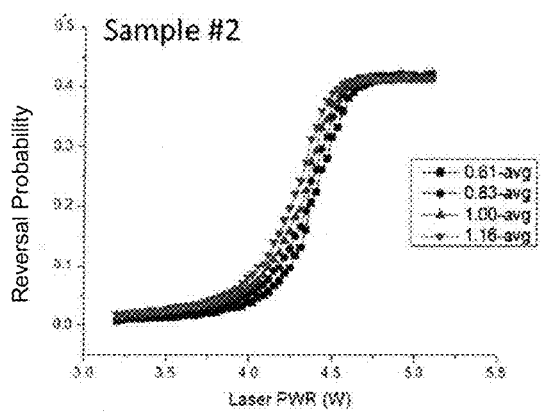
FIGS. 14-15 show reversal probability as a function of laser power for varying external field values in accordance with various embodiments.
Figure 15:
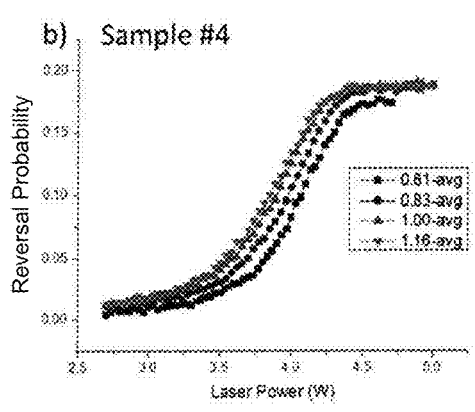

FIGS. 14 and 15 are graphs showing reversal probability as a function of laser power. The data of FIGS. 14 and 15 represent analysis results produced at block 514 of FIG. 5. FIG. 14 shows reversal (switching) probability curves measured under four different external field values (e.g., about 0.6T, 0.8T, 1T, and 1.2T) for a first sample (named sample #2). As discussed above in connection with FIG. 9, the reversal probability versus laser power curve of FIG. 14 can be fitted with a nonlinear function such as a bi-error function. The black shapes are experimental data, and the solid lines are nonlinear fits for each set of data using bi-error functions. Similarly, FIG. 15 shows reversal (switching) probability curves measured under four different external field values (e.g., 0.6T, 0.8T, 1T, and 1.2T) for a second sample (named sample #4).

Figure 16:
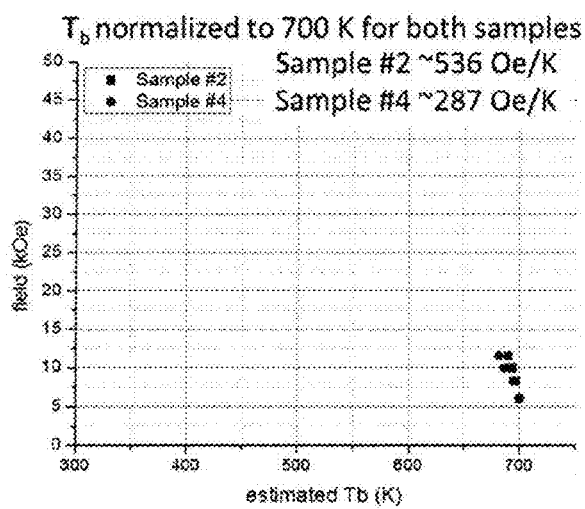
FIG. 16 shows switching field as a function of sample temperature in accordance with various embodiments.
Figure 17:
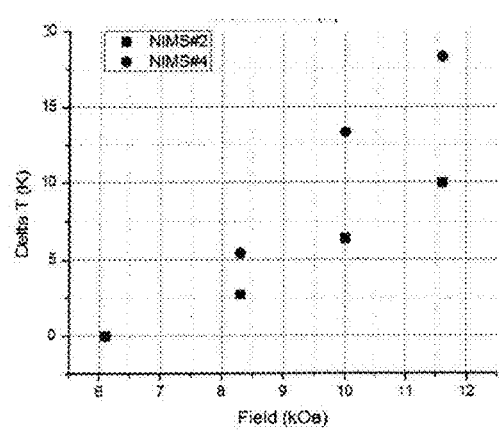
FIG. 17 shows a shift in switching temperature as a function of applied field in accordance with various embodiments.

As can be seen from FIGS. 14 and 15, switching curves shift to lower laser power (lower temperature) as the applied field increases. To obtain the actual sample temperature at various laser powers, a linear relationship can be assumed between laser power and sample temperature rise from ambient. In this embodiment, for every Watt increase in laser power, media temperature rises by approximately 100 Kelvin. The switching field can then be plotted as a function of switching temperature as shown in FIG. 16. The slope of the linear fitting to the curve of FIG. 16 then yields the anisotropy field gradient values. Alternatively, the shift (delta) in switching temperature can be plotted as a function of the applied field as shown in FIG. 17. Sample #4 (results shown in FIG. 15) has a smaller particle size than sample #2 (results shown in FIG. 14). This results in a lower measured anisotropy field temperature slope (dHk/dT) (287 Oe/K as compared with 536 Oe/K), which is consistent with expectations.

In the above embodiment, an entire track is written and analyzed. Therefore the obtained field gradient is the once-around average of the entire track. A variation of this method is to magnetize a small spot instead of the entire track and to obtain a field gradient for that spot only. The spot size is determined by the focus of the readout laser (which should be narrower than the heating spot size for temperature uniformity).

As described herein, an anisotropy parameter such as anisotropy field temperature slope can be measured in a fast, non-destructive manner for HAMR media by measuring shifts in switching temperature under different external fields. To enable the measurements, the experimental setup must have the capability of independent control over field and sample temperature, as well as means of non-destructive readout of remanent magnetic moments (such as using Kerr effect or an inductive reader). The method involves obtaining reversal probability curves as a function of sample temperature (laser power) and applied field. From these data, switching temperature can be then determined for various applied fields, and anisotropy field temperature slope (dHk/dT) can then be obtained by linear fitting to the data.

In further embodiments, methods for producing HAMR media with high anisotropy field temperature slope are described. The high anisotropy field temperature slope is a factor in producing a higher effective field gradient: $dHk/dx=(dHk/dT)x$ $(dT/dx)$. A higher effective field gradient assists in achieving high linear density capability by producing smaller transition jitter. To achieve high linear density (e.g., >2500 kfci), larger dHk/dT (e.g., >300 Oe/K) is needed.

Figure 18A:
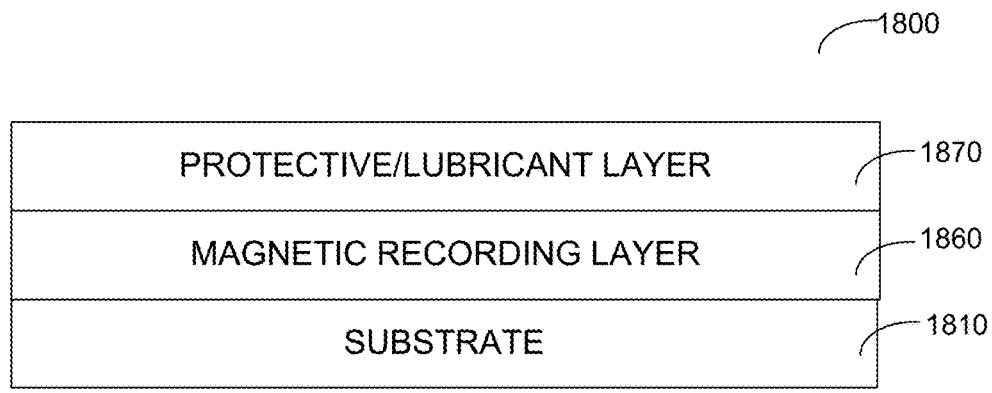
FIGS. 18A-B are cross-sectional views of media structures in accordance with various embodiments.
Figure 18B:
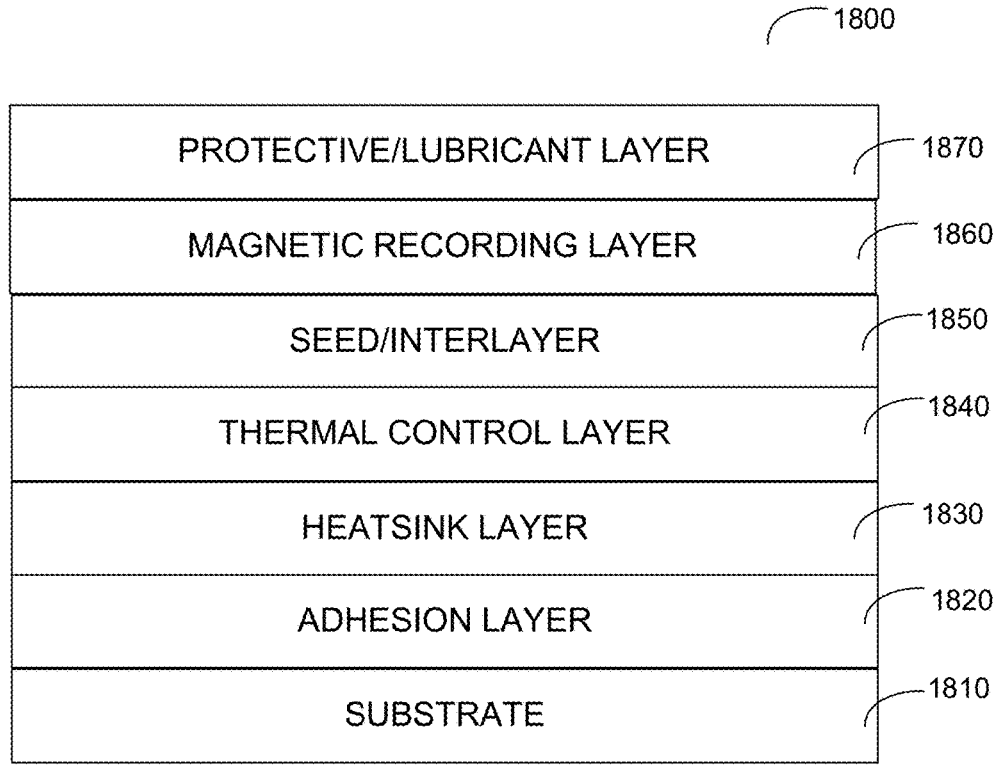

HAMR media structures can include various layers and combinations of layers, such as those shown in FIGS. 18A-B. FIG. 18A illustrates the layers of a media structure 1800 including a magnetic recording layer comprising anisotropy parameters as discussed above. FIG. 18A includes a substrate 1810 with a magnetic recording layer 1860 disposed over the substrate 1810 and an optional protective/lubricating layer 1870 on top of the media stack. The magnetic recording layer 1860 has an anisotropy field temperature slope (dHk/dT) greater than about 300 Oe/K. The anisotropy field temperature slope is provided, in part, by the composition of the magnetic recording layer 1860. For example, the magnetic recording layer 1860 is a granular layer comprising $FePtM_xY$, wherein M represents doping materials for lowering the Curie temperature of the magnetic recording layer 1860, which typically lowers the write temperature required by the heat assisted recording. Thus, the laser power required for the HAMR recording heads is reduced, and the head and interface reliability is improved. Y represents a segregant material. In certain embodiments, the doping materials are selected from a group including Ni, Cu, Ag, Rh, Ru, Mn, Nd, Au, etc. The segregant material decouples the FePt grains in the magnetic recording layer 1860, and in certain embodiments is selected from a group including carbon, carbide (SiC, TiC, WC, etc.), oxide ($SiO_2$, $TiO_2$, MgO, $TaO_x$, $WO_x$, $HfO_x$, BO, etc.), nitride (SiN, BN, TiN, etc.) materials and any combination thereof. The stack can include various additional layers, some of which are illustrated in FIG. 18B. For example, the media structure 1800 of FIG. 18B includes a substrate 1810, an adhesion layer 1820, a heat sink layer 1830, a thermal control layer 1840, an interlayer and/or a seed layer 1850, a granular magnetic recording layer 1860, and a protective/lubricating layer 1870. Layers below the magnetic recording layer such as the seed/interlayer 1850, thermal control layer 1840, and heatsink layer 1830 can be referred to collectively as a soft underlayer (SUL). Each of the illustrated layers can also comprise a plurality of layers. The magnetic layer and the process used to produce said magnetic layer provides HAMR media with high dHk/dT.

Figure 19:
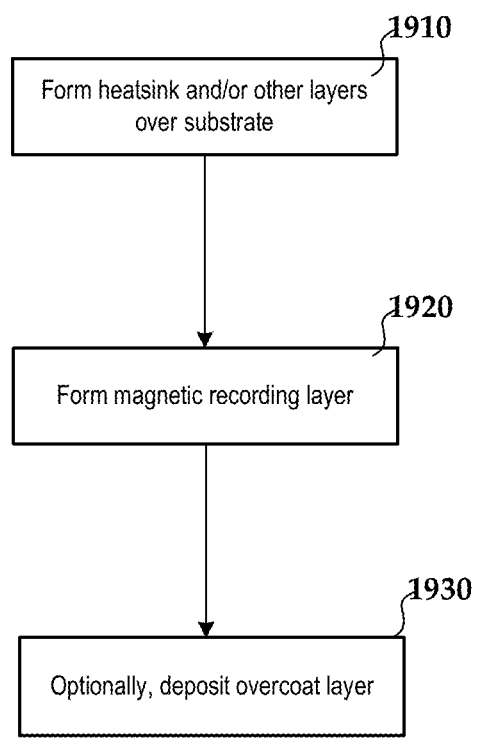
FIG. 19 illustrates a method for making a media structure in accordance with various embodiments.

FIG. 19 is a flow diagram of a process of forming a magnetic stack such as a HAMR media stack in accordance with various embodiments. Optionally, one or more additional layers, e.g., thermal control, heatsink, adhesion, seed-layers, are formed 1910 over a substrate. A magnetic recording layer is formed 1920 over the substrate (and over the additional layers, if present). The magnetic recording layer is formed at a process temperature greater than 450° C. to achieve high $L1_0$ chemical ordering for an FePtM alloy in a $FePtM_xY$ magnetic layer. Also, the doping level is controlled for the FePtM alloy. For example, the doping level is reduced or minimized to avoid, or reduce, deterioration of dHk/dT. The doping level x is controlled to be between about 0.01-10% of the magnetic recording layer in order to reduce recording temperature without reducing the media recording performance to support high linear density capability. When the grain size of the magnetic recording layer is reduced, the process temperature or method is correspondingly adjusted to produce high $L1_0$ chemical ordering in the FePtM alloy. Optionally, an overcoat layer, or layers, can be disposed on the magnetic recording layer 1930. The magnetic layer produced by the process of FIG. 19 provides HAMR media with high dHk/dT, such as greater than about 300 Oe/K.

Although specific embodiments have been illustrated and described herein, it will be appreciated by those of ordinary skill in the art that a variety of alternate and/or equivalent implementations can be substituted for the specific embodiments shown and described without departing from the scope of the present disclosure. This application is intended to cover any adaptations or variations of the specific embodiments discussed herein. Therefore, it is intended that this disclosure be limited only by the claims and the equivalents thereof.

What is claimed is:

1. A stack comprising:
   a substrate; and
   a magnetic recording layer comprising $FePtM_xY$ disposed on the substrate, wherein M comprises doping materials for controlling Curie temperature, Y comprises a segregant, and the magnetic recording layer has an effective anisotropy field temperature slope (dHk/dT) greater than about 200 Oe/K.

2. The stack of claim 1, wherein M is selected from a group, comprising: Ni, Cu, Ag, Rh, Ru, Mn, Nd, and Au.

3. The stack of claim 1, wherein Y is selected from a group comprising one or more of carbon, carbide, oxide, and nitride.

4. The stack of claim 3, wherein Y comprises at least one of C, SiC, TiC, WC, $SiO_2$, $TiO_2$, MgO, $TaO_x$, $WO_x$, $HfO_x$, BO, SiN, BN, and TiN.

5. The stack of claim 1, wherein the magnetic recording layer has a linear density of greater than 2500 kfci.

6. The stack of claim 1, wherein M comprises 10% or less of the magnetic recording layer.

7. The stack of claim 1, wherein $FePtM_x$ grains have $L1_0$ chemical ordering in the magnetic recording layer.

8. The stack of claim 1, further comprising a heatsink layer.

9. The stack of claim 1, wherein the magnetic recording layer has a thickness of up to about 10 nm.

10. The stack of claim 1, wherein the magnetic recording layer has an anisotropy greater than 30 kOe.

* * * * *